(12) United States Patent
Kunsman et al.

(10) Patent No.: US 7,069,116 B2
(45) Date of Patent: Jun. 27, 2006

(54) HIGH IMPEDANCE FAULT DETECTION

(75) Inventors: Steven A. Kunsman, Allentown, PA (US); Ismail I. Jouny, Easton, PA (US); Stephen Kaprielian, Worcester, MA (US)

(73) Assignee: ABB Inc., Norwalk, CT (US)

( * ) Notice: Subject to any disclaimer, the term of this patent is extended or adjusted under 35 U.S.C. 154(b) by 100 days.

(21) Appl. No.: 10/770,270

(22) Filed: Feb. 2, 2004

(65) Prior Publication Data
US 2005/0171647 A1    Aug. 4, 2005

(51) Int. Cl.
G06F 19/00 (2006.01)
H02H 3/42 (2006.01)
G01R 31/08 (2006.01)

(52) U.S. Cl. .................. 700/293; 700/22; 702/58; 361/79; 324/525

(58) Field of Classification Search ............... 700/22, 700/48, 292, 293; 702/27–59; 324/600, 324/525; 361/78, 79
See application file for complete search history.

(56) References Cited

U.S. PATENT DOCUMENTS

| | | | |
|---|---|---|---|
| 4,297,738 A | 10/1981 | Lee | |
| 4,466,071 A | 8/1984 | Russell, Jr. | |
| 4,871,971 A | 10/1989 | Jeerings et al. | |
| 5,452,223 A * | 9/1995 | Zuercher et al. | 702/58 |
| 5,475,556 A | 12/1995 | Yoon et al. | |
| 5,512,832 A | 4/1996 | Russell et al. | |
| 5,537,327 A * | 7/1996 | Snow et al. | 700/293 |
| 5,550,751 A * | 8/1996 | Russell | 700/293 |
| 5,602,709 A | 2/1997 | Al-Dabbagh | |
| 5,724,247 A | 3/1998 | Dalstein | |
| 6,453,248 B1 * | 9/2002 | Hart et al. | 702/58 |
| 6,718,271 B1 * | 4/2004 | Tobin | 702/58 |
| 2001/0036047 A1 * | 11/2001 | Macbeth et al. | 361/42 |
| 2003/0101008 A1 * | 5/2003 | Hart | 702/57 |

OTHER PUBLICATIONS

Buchholz et al; High Impedance Fault Detection Device Tester; Journal IEEE Transactions on Power Delivery, vol. 11, No. 1, Jan. 1996, Powertech Labs Inc., Surrey, B.C. Canada V3W 7R7.

(Continued)

*Primary Examiner*—Paul L. Rodriguez
(74) *Attorney, Agent, or Firm*—Michael M. Rickin; Paul R. Katterle

(57) ABSTRACT

An apparatus, system, and method for detecting high impedance faults in electrical power lines using a composite high impedance fault detection system having a voter logic that samples the logical outputs from a plurality of independent high impedance detection systems and determines a high impedance fault if any two of the plurality of independent high impedance detection systems indicates a high impedance fault. Preferably, the plurality of high impedance detection systems include a wavelet based high impedance fault detection system having a first logical output, a higher order statistics based high impedance fault detection system having a second logical output, and a neural net based high impedance fault detection system having a third logical output. Preferably, each of the plurality of high impedance fault detection systems includes an independent high impedance fault detection application that independently detects a high impedance fault on the electrical power line.

18 Claims, 7 Drawing Sheets

Block diagram of a composite high impedance fault detection system

OTHER PUBLICATIONS

Russell et al; Arcing Fault Detection for Distribution Feeders: Security . . . , Journal IEEE Transactions on Power Delivery, vol. 10, No. 2, Apr. 1995; Power System Automation Lab, Texas.

Ebron et al; A Neural Network Approach To The Detection of Incipient Faults on Power Distribution Feeders; IEEE Transactions on Power Delivery, vol. 5, No. 2, Apr. 1990; Electric Power Research Center, Raleigh, NC.

Russell et al; An Arcing Fault Detection Technique Using Low Frequency Current Components—Performance Evaluation Using Recorded Field Data; Journal IEEE Transactions on Power Delivery vol. 3, No. 4, Oct. 1988; Texas A&M University, College Station, Texas.

Benner et al; Practical High Impedance Fault Detection for Distribution Feeders; IEEE Transactions on Power Delivery, vol. 33, No. 3, pp. 635-640, May/Jun. 1997; Power System Automation Laboratory, College Station, Texas.

Lazkano et al; A New Approach To High Impedance Fault Detection Using Wavelet Packet Analysis; Proceedings of Ninth International Conference on Harmonics & Quality of Power, vol. 3, pp. 1005-1010, 2000.

Russell et al; Performance of high-impedance fault detection algorithms in long-term field trials; Elsevier Science S.A. Power System Automation Laboratory, College Station, TX 77843.

C.J. Kim et al; Classification of Fualts and Switching Events by Inductive Reasoning and Expert System Methodology; Journal IEEE Transactions on Power Delivery, vol. 4, No. 3, Jul. 1989; Texas A&M University; College Station, Texas 77843.

A.M. Sharaf et al; A Third Harmonic Sequence Ann Based Detection Scheme For High Impedance Faults; Canadian Conference on Electrical and Computer Engineering; University of New Brunswick, Canada.

J.T. Tengdin et al; Application of High Impedance Fault Detectors; A Summary of the Panel Session Held at the 1995 IEEE PES Summer Meeting.

M. Al-Dabbagh et al; Neural Networks Based Algorithm For Detecting High Impedance Faults on Power Distribution Lines; 1999 IEEE; Department of Electrical and Communication Engineering; Papua, New Guinea.

L.A. Snider et al; The Artificial Neural Networks Based Relay Algorithm For Distribution System High Impedance Fault Detection; Journal from Proceedings of the 4th International Conference on Advances in Power System Control, Operation and Management, APSCOM-97, Hong Kong, Nov. 1997.

R. Patterson et al; A Microprocessor-based Digital Feeder Monitor with High-Impedance Fault Detection; Forty-Seventh Annual Conference for Protective Relay Engineers; GE Protection and Control, Malvern, PA; Dept. of Electrical Engineering Texas A&M University, College Station, Texas.

C.J. Kim et al; A Parameter-Based Process For Selecting High Impedance Fault Detection Techniques Using Decision Making Under Incomplete Knowledge; Journal IEEE Transaction on Power Delivery, vol. 5, No. 3, Jul. 1990; Texas A&M University, College Station, Texas 77843.

C.J. Kim et al; A Learning Method For Use In Intelligent Computer Relays For High Impedance Faults; Journal IEEE Transactions on Power Delivery, vol. 6, No. 1, Jan. 1991; Texas A&M University, College Station, Texas 77843.

C.J. Kim et al; High-impedance fault detection system using an adaptive element model; Journal IEEE Proceedings-C, vol. 140, No. 2, Mar. 1993; Department of Electrical Engineering, Texas A&M University, College Station, Texas 77843.

Ron Patterson; Signatures and Software Find High-Impedance Faults; IEEE Computer Applications in Power, Jul. 1995.

Carl L. Benner et al; Practical High-Impedance Fault Detection on Distribution Feeders; IEEE Transactions on Industry Applications. vol. 33, No. 3, May/Jun. 1997.

David C. Yu et al; An Adaptive High and Low Impedance Fault Detection Method; Journal IEEE Transactions on Power Delivery, vol. 9, No. 4, Oct. 1994; University of Wisconsin-Milwaukee, Milwaukee, WI 53201; Puget Sound Power & Light Company, Bellevue, WA 98004.

B. Michael Aucoin et al; High Impedance Fault Detection Implementation Issues; Journal IEEE Transactions on Power Delivery, vol. 11, No. 1, Jan. 1996; Texas A&M University, College Station, TX 77843; Rochester Gas and Electric, Rochester, NY 14649.

* cited by examiner

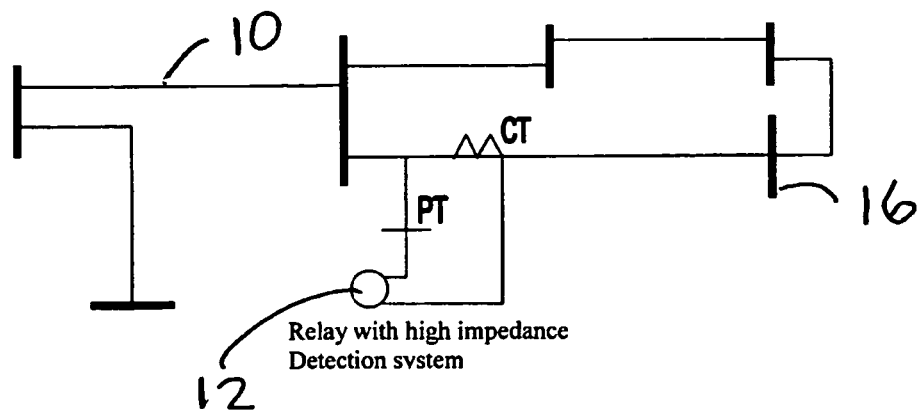
Figure #1: Electrical power distribution network having a composite high impedance fault detection system

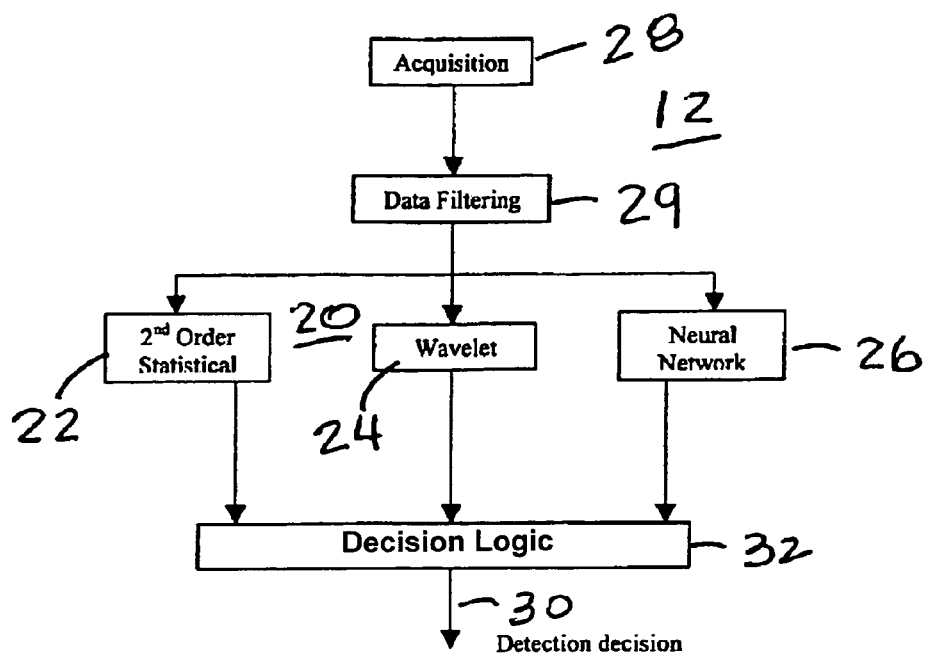
Figure #2: Block diagram of a composite high impedance fault detection system

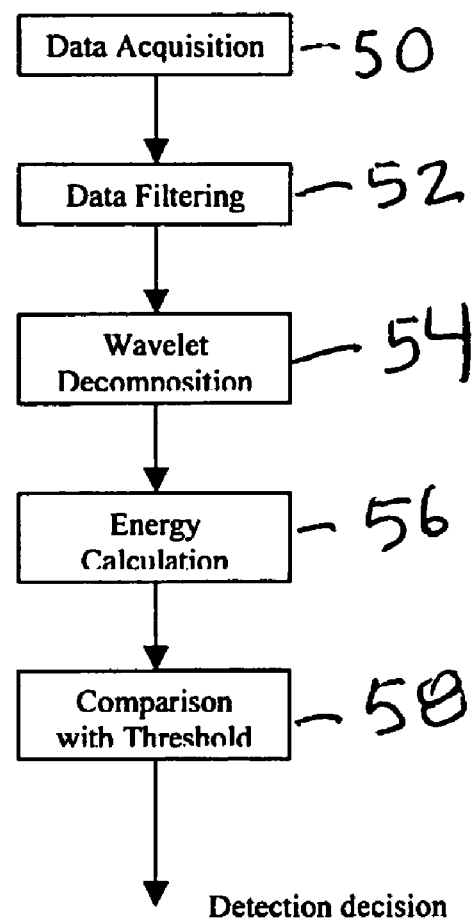
Figure #4: Flowchart showing a wavelet based high impedance fault detection system

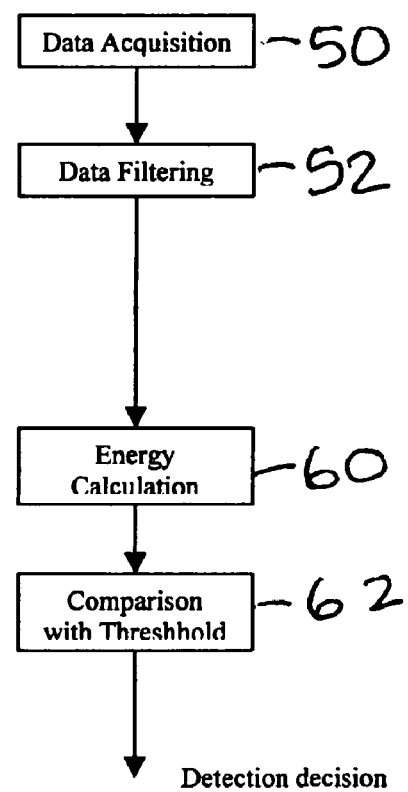
Figure # 5: Flowchart showing a 2$^{nd}$ order statistic based high impedance fault detection system

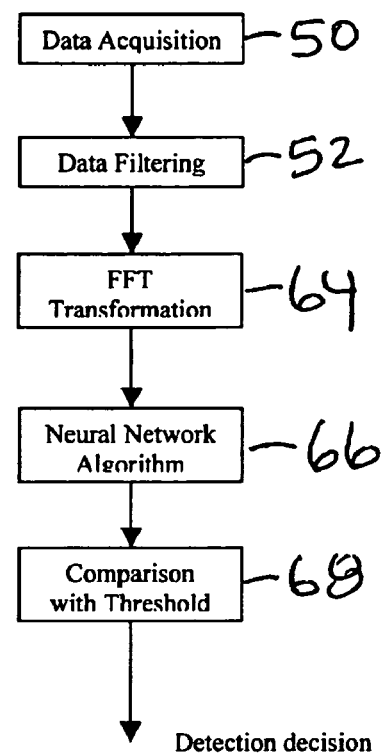
Figure #6: Flowchart showing a neural network based high impedance fault detection system

HIGH IMPEDANCE FAULT DETECTION

FIELD OF THE INVENTION

The present invention relates in general to fault detection in electrical power systems, and particularly, to high impedance fault detection in electrical power distribution lines.

DESCRIPTION OF THE PRIOR ART

High impedance faults are characterized by a high impedance at the point of fault. Accordingly, a high impedance fault typically produces a small fault current level. High impedance faults can, therefore, be generally defined as those faults that do not draw sufficient fault current to be recognized and cleared by conventional overcurrent devices, such as protective relays.

High impedance faults result when an energized primary conductor comes in contact with a quasi-insulating object, such as a tree, a structure or equipment, a pole crossarm, or falls to the ground. Typically, a high impedance fault exhibits arcing and flashing at the point of contact. The significance of these hard to detect faults is that they represent a serious public safety hazard as well as a risk of arcing ignition of fires. As such, high impedance fault detection has been a major concern of protective relaying for a long time.

Protective relays are usually designed to protect equipment (line, transformer, etc.) from damage by isolating the equipment during high current conditions. High impedance faults, are typically found on distribution circuits, results in very little, if any, current. High impedance faults do not pose a threat to equipment and by their nature they can not be detected with conventional overcurrent devices. Nonetheless, the dangers of a downed conductor are obvious to all. Possibility of fire, property damage, and someone coming into contact with the live conductor are some of the major concerns.

Also, legal issues in promising a comprehensive solution may be very costly for manufacturers (e.g., liability issues). For example, tripping the breaker following high impedance fault detection is not a clear cut choice. While the high impedance fault is a danger, tripping the feeder unnecessarily will create new hazards by de-energizing homes, traffic signals, offices, etc. The effects of incorrectly determining a high impedance fault will have economic and legal ramifications.

The utility must always have the safety of the public as a top priority. However, high impedance fault detection has not been possible in the past and realistic detection algorithms are not anticipated that can detect 100% of all downed conductors, while having 100% security against misoperation. The utilities need an economic solution and a system that can reliably detect high impedance faults and are also secure in that they do not falsely detect a high impedance fault (HIF).

Some of the earliest HIF detection schemes involved arcing fault detection techniques that used low frequency current components and are described in B. Russell, K. Mehta, R. Chinchali, "An arcing fault detection technique using low frequency current components performance evaluation using recorded data", IEEE Transactions on Power Delivery, Vol. 3, No. 4, pp. 1493–1500, October 1988. This conventional arcing fault detection technique examined low frequency currents, namely 180 and 210 Hz, to determine whether an arcing fault had occurred. A hierarchical detection scheme was developed that is based on signature energy and using a dynamic threshold. Although the algorithm was field tested, its performance limited its practical applicability.

U.S. Pat. No. 4,466,071 entitled "High Impedance Fault Detection Apparatus and Method" describes a conventional high impedance fault detection technique that monitors and evaluates the high frequency components of each cycle of an alternating current. The occurrence of a high impedance fault is determined based on a significant increase in magnitude of the high frequency components for a prescribed period of time and of a prescribed pattern. However, this patent only considers a very specific feature of high impedance fault currents and does not consider high impedance fault currents in a multi-resolution framework. U.S. Pat. No. 5,512,832 entitled "Energy Analysis Fault Detection System" describes a conventional detection technique that compares energy values of load currents to preset thresholds in order to detect an arcing fault on a power line. However, this patent is very basic in its nature and does not consider or use other features of load currents to detect a fault.

Another HIF detection scheme devised a neural network detection system that is trained to identify HIF faults and is described in S. Ebron, D. Lubkeman, an M. White, "A neural network approach to the detection of incipient faults on power distribution feeders", IEEE Transactions on Power Delivery, Vol. 5, No. 2, pp. 905–914, April 1990. Although this study was conducted in the early days of neural network development it did highlight the potential of adaptive learning systems in HIF detection. That pilot study did not involve any experimentally generated data but was developed and tested using simulated HIF data generated using electromagnetic transients program (EMTP) software. Furthermore, the neural network used in that study had a relatively simple architecture.

U.S. Pat. No. 5,537,327 entitled "Method and Apparatus For Detecting High-Impedance Faults In Electrical Power Systems" describes a conventional high impedance fault detection technique that uses a neural network to detect high impedance faults. However, the features used by U.S. Pat. No. 5,537,327, rely on derivatives of the maxima and minima of the load current. Also, zero crossings are used to detect a fault. The results of long term HIF detection tests conducted with the collaboration of five utilities and including staged faults, naturally occurring faults, and normal system operation were published by B. Russell and C. Benner, in "Arcing fault detection for distribution feeders: security assessment in long term field trials", IEEE Transactions on Power Delivery, Vol. 10, No. 2, pp. 676–683, April 1995. That study described in great detail some of the practical aspects of HIF detection, but it does show that a 75% HIF detection was the best achievable performance using their randomness based algorithm.

British Columbia Hydro and Powertech Labs Inc. tested three HIF detection systems including that of Russell et al. described directly above (see, V. Bucholz, M. Nagpol, J. Nielson, B. Parsi, and W. Zarecki, "High impedance fault detection device tester", IEEE transactions on Power Delivery, Vol. 11, No. 1, pp. 184–190, January 1996). The most significant result was that the higher frequencies of HIF signatures played an important role in HIF detection and in distinguishing HIF from other types of faults or normal arcing operations.

In another HIF detection study, the results of years of experience with HIF detection and testing are summarized and the formal evaluation of the performance of a randomness based HIF detection algorithm are disclosed. (see, C. Benner and B. Russell, "Practical high impedance fault detection on distribution feeders", IEEE Transactions on Power Delivery, Vol. 33, No. 3, pp. 635–640, May/June 1997). Despite its simplicity, and its ad hoc nature, this algorithm does deliver relatively reliable HIF detection. This technique was implemented in a relay sold by General Electric known as the Digital Feeder Monitor (DFM) and uses nine algorithms based mainly on energy, randomness, interharmonics, etc. in layers as shown in FIG. 4 on page 8 by R. Patterson, W. Tyska, B. Don Russell and B. Michael Aucoin, "A Microprocessor-Based Digital Feeder Monitor With High-Impedance Fault Detection", presented to the Forty-Seventh Annual Conference for Protective Relay Engineers, Texas A&M University, College Station, Tex., Mar. 21–23, 1994. In contrast the technique of the present invention as described in the preferred embodiment uses only three algorithms based on neural networks, statistics and wavelets and has a voting scheme that determines the detection of the HIF fault based on each of the algorithms independently detecting a HIF condition.

Other publications that describe HIF fault detection studies and techniques are:

a. Snider, L. A.; Yuen, Y. S., International Conference on Power Systems Transients 1999, PP. 235–40, a publication of a paper given at the conference held 20–24 Jun. 1999 in Budapest, Hungary, which presents an artificial neural network (ANN) based relay algorithm that uses Fourier analysis to determine low order harmonic vectors which were then fed to a perceptron or feed-forward neural network. The networks were trained by feeding them with input vectors consisting of magnitudes or phase angles of low order harmonics. The present invention uses a neural network algorithm which is different as it is a multiple-layer perceptron that uses the waveform samples as an input, not the discrete Fourier transform (DFT) or fast Fourier transform (FFT) of the low order harmonics.

b. Don Russell, B.; Benner, Carl L., Electric Power Systems Research v 31 n 2 Nov. 1994. p 71–77, which presents an intelligent analysis system that processes the outputs from several algorithms to determine the confidence that a fault exists. This is basically what is implemented in the GE Digital Feeder Monitor (DFM). This system processes the odd, even, and non-harmonics, and uses the Energy and Randomness algorithms for the arc detection analysis. The system uses the Arc Confidence Level Generator to generate the confidence level and the Expert Load Pattern Analyzer for arcing persistence.

c. Benner, C. L.; Russell, D., Rural Electric Power Conference 1996 PP. B2/38–43 sponsored by the Rural Electr. Power Committee of the IEEE Ind. Applications Soc. IEEE, a publication of a paper given at the Rural Electric Power Conference held on 28–30 Apr. 1996 in Forth Worth, Tex. which focuses on having multiple detection algorithms to successfully balance fault detection with fault discrimination. The paper does describe the Energy and Randomness algorithms of the DFM, as well as the Arc Confidence Level Generator and Expert Load Pattern Analyzer, but does not go into great detail regarding this implementation. The paper basically states that having multiple algorithms (as with the DFM) enhance detection of these types of faults. The paper goes on to say that commercial development has occurred with GE. Even though this paper does support multiple algorithm detection it does not challenge any of the specific algorithms used in the present invention.

d. Lazkano, A.; Ruiz, J.; Aramendi, E.; Leturiondo, L. A., Proceedings of Ninth International Conference on Harmonics and Quality of Power, Vol. 3, pp. 1005–1010, 2000, "A New Approach to High Impedance Fault Detection Using Wavelet Packet Analysis", a publication of the paper given at the conference which was held in Orlando, Fla. which presents an HIF detection technique related to wavelet packet analysis. It seems to be similar to the wavelet algorithm implemented in the present invention as it uses the Daubechies_4 mother wavelet with 4-level decomposition of the arc current signal. However, it analyzes only the $2^{nd}$ harmonic value of the current. The wavelet algorithm of the present invention analyzes current components in the 320–400 Hz region. Thus, the theory and implementations are different and the paper only describes theoretical results.

e. Al-Dabbagh, M.; Al-Dabbagh, L., IJCNN'99. International Joint Conference on Neural Networks. Proceedings, Vol. 5, pp. 3386–90, 2000, "Neural Networks Based Algorithm for Detecting High Impedance Faults on Power Distribution Lines", a publication of the paper given at the conference which was held Jul. 10–16, 1999 in Washington, D.C. which describes a neural network detection algorithm that is very similar to the neural network detection algorithm of the present invention. However, there is a significant difference between the two algorithms. The algorithm in this paper is also a multi-layer network with back-propagation, but this algorithm uses the DFT of the current and voltage signals as inputs, instead of the individual samples themselves. This paper does not indicate the number of inputs, outputs, and hidden layers associated with the network, and tests the algorithm using EMTP/ATP simulations.

As can be appreciated, conventional means for detecting high impedance faults in electrical power lines are typically not always conclusive and/or reliable and can be expensive. Therefore, a need exists for a new reliable and economic solution for detecting high impedance faults in electrical power lines which addresses the engineering and legal ramifications of detecting and determining what to do once a high impedance fault is detected.

SUMMARY OF THE INVENTION

A method for detecting high impedance faults in electrical power lines comprising:

providing a plurality of high impedance fault detection means each having an output;

independently detecting a high impedance fault condition in the electrical power lines using the plurality of high impedance fault detection means; and determining a presence of a high impedance fault using a decision means, wherein the decision means determines a high impedance fault if any two or more of the independent outputs are indicative that an associated one of the plurality of high fault detection means has detected a high impedance fault condition.

A system for detecting high impedance faults in an electrical power system having an alternating current flowing therethrough comprising:

an electrical power supply;

one or more interconnected electrical power conductors; and a composite high impedance fault detection system connected to the one or more electrical power conductors for detecting a high impedance fault when at least two of a plurality of individual high impedance fault detection systems each independently detect the occurrence of a high impedance fault on the electrical power conductors.

An apparatus for detecting a high impedance fault in electrical power lines comprising:

a wavelet based system having a first logical output for detecting a high impedance fault condition in the electrical power lines;

a higher order statistics based system having a second logical output for detecting a high impedance fault condition in the electrical power lines; and a neural network based system having a third logical output for detecting a high impedance fault condition in the electrical power lines, the wavelet based system, the higher order statistics based system and the neural network based system each independently detecting the same high impedance fault condition in the electrical power lines.

An apparatus for detecting a high impedance fault in electrical power lines comprising:

a plurality of high impedance fault detection means each having an output, each of the plurality of high impedance fault detection means independently detecting a high impedance fault condition on the electrical power lines; and a decision means for determining a high impedance fault if any two or more of the independent outputs are indicative that an associated one of the plurality of high fault detection means has detected a high impedance fault condition.

A protective relay for electrical power distribution lines, comprising:

one or more computing devices, only one of the computing devices used for detecting both non-high impedance faults and high impedance faults in the electrical power distribution lines.

DESCRIPTION OF THE DRAWING

The foregoing summary, as well as the following detailed description of the preferred embodiments, is better understood when read in conjunction with the appended drawings. For the purpose of illustrating the invention, there is shown in the drawings embodiments that are presently preferred, it being understood, however, that the invention is not limited to the specific methods and instrumentalities disclosed. In the drawings:

FIG. 1 is a schematic diagram of an exemplary electrical power distribution system having a composite high impedance fault detection system in accordance with the present invention;

FIG. 2 is a block diagram showing an exemplary composite high impedance fault detection system in accordance with the present invention;

FIG. 4 shows a flowchart showing a wavelet based high impedance fault detection system;

FIG. 5 shows a flowchart showing a higher order statistics based high impedance fault detection system;

FIG. 6 shows a flowchart showing a neural network based high impedance fault detection system.

DESCRIPTION OF THE PREFERRED EMBODIMENT(S)

Figure 2A:
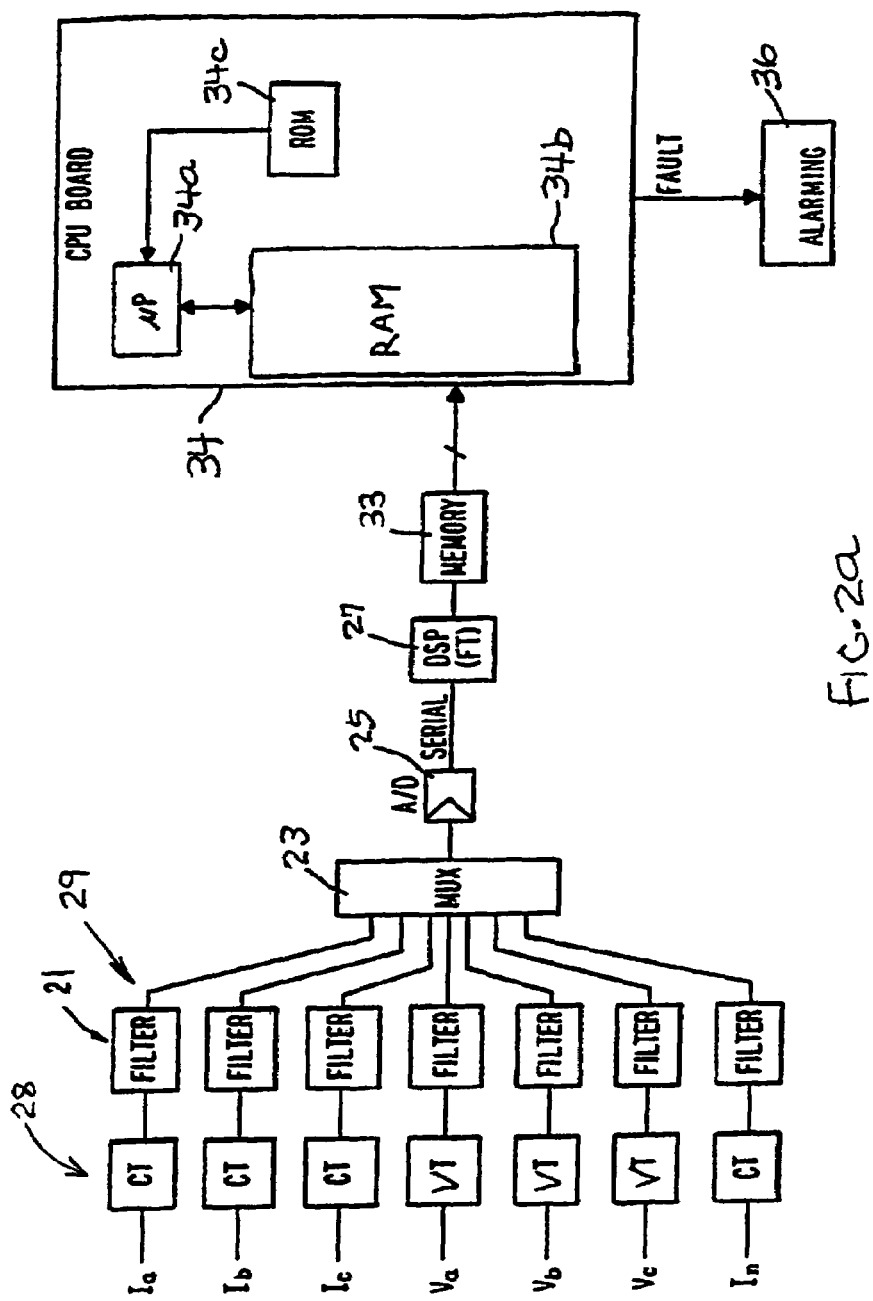
FIG. 2a is a block diagram showing a typical embodiment for the exemplary composite high impedance fault detection system shown in FIG. 2.

The present invention considers high impedance faults in a multi-resolution framework. The present invention relates to a new approach to high impedance fault detection that includes a multi-scheme high impedance fault detection scheme employing a plurality of individual fault detection systems each having their own algorithm application that use various features of phase and/or ground currents to individually detect a high impedance fault. Suitable features of the currents include their wavelength signatures, their fourth order moment, their sample values as seen by a neural net, and the like. FIG. 1 shows a schematic diagram of an electrical power distribution system having an electrical power distribution line 10 and a composite high impedance detection system 12. The solid vertical bars in FIG. 1 are bus bars 16 and represent the interconnection of multiple distribution lines. The composite high impedance detection system 12 includes a plurality of individual high impedance fault detection systems which are not shown in FIG. 1 but are shown in FIG. 2. Also shown in FIG. 1 are the potential transformer PT and the current transformer CT which provide the typical analog inputs for a protective relay.

These individual high impedance fault detection systems have individual algorithms for individually detecting high impedance faults. These algorithms can use, for example, wavelet, higher order statistics, neural network, and the like to identify the presence of high impedance fault independently of each of the other system algorithms. The individual high impedance fault detection algorithms can each have a different confidence level. A fault is identified as a high impedance fault once it is detected independently by the algorithms and processed through a decision logic.

FIG. 2 shows an exemplary composite high impedance fault detection system 12 including a higher order statistics based high impedance fault detection system 20 identified in FIG. 2 as a $2^{nd}$ order statistical system 22, a wavelet based high impedance detection system 24, and a neutral network based high impedance detection system 26. As shown in FIG. 2, an input connection 28 labeled "Acquisition" in FIG. 2 and an output connection 30 labeled "Detection decision" in FIG. 2 are provided for communicating an electrical signal between the electrical power distribution system and the high impedance fault detection systems 22, 24, 26.

For example, the input connection 28 receives an electrical signal from a sensing device coupled to the electrical power distribution line. The sensing device can include any suitable sensing device, such as the current transformer shown in FIG. 1. The output of acquisition 28 is processed through data filtering 29 which provides band limited signals to each individual high impedance fault detection systems 22, 24, 26.

As shown in FIG. 2, each individual high impedance fault detection system 22, 24, 26 includes a logical output that is communicated to the composite high impedance fault detection system shown in FIG. 2 as "Decision Logic" 32 which determines whether a high impedance fault has occurred. The composite high impedance fault detection system detects and identifies a fault as a high impedance fault once it determines that at least two individual high impedance fault detection systems 22, 24, 26 have independently detected a high impedance fault. This composite feature provides increased security against false identification while improving the probability of detecting all high impedance faults. Each high impedance fault detection system 22, 24, 26 and its associated algorithm, as well as the composite algorithm are discussed in detail below.

The output connection, that is "Detection decision" 30 of Decision Logic 32 provides the logical output from each of the individual wavelet based high impedance detection systems, that is, the higher order statistics based high impedance detection system 22, the wavelet based high impedance detection system 24 and the neural network based high impedance detection system 26, to the composite high impedance detection system.

The higher order statistics based high impedance detection system 22, the wavelet based high impedance detection system 24 and the neural network based high impedance detection system 26 and the decision logic 32 are implemented in a microprocessor which is also used for implementing non-HIF detection algorithms such as protection, other than HIF detection, and control algorithms and if desirable metering and/or monitoring algorithms. Thus in the present invention, one microprocessor is used for implementing both non-HIF detection and HIF detection algorithms.

FIG. 2a shows in block diagram form a typical embodiment for acquisition 28, filtering 29, high impedance fault detection system 20 and decision logic 32 of FIG. 2 as well as other elements typically associated with a protective relay. As is shown in FIG. 2a, acquisition 28 is the combination of the potential transformer PT and current transformer CT shown in FIG. 1 whose outputs are filtered by an associated one of filters 21 and provided to a multiplexer 23.

The output of multiplexer 23 is connected by an analog to digital converter 25 to the input of digital signal processor 27. The embodiment shown in FIG. 2a also includes a memory 33 and a CPU board 34 which includes a microprocessor 34a, a random access memory 34b and a read only memory 34c. As was described above in connection with FIG. 2, each of the individual high impedance fault detection systems 22, 24, 26 shown in that figure are implemented in microprocessor 34a. Also as was described above in connection with FIG. 2, microprocessor 34a is also used for implementing non-HIF detection algorithms such as protection, other than HIF detection, and control algorithms and if desirable metering and/or monitoring algorithms. The output of CPU board 34, which is an indication that a high impedance fault or a non-high impedance fault condition was determined is connected to alarming 36.

Test Data

Figure 3:
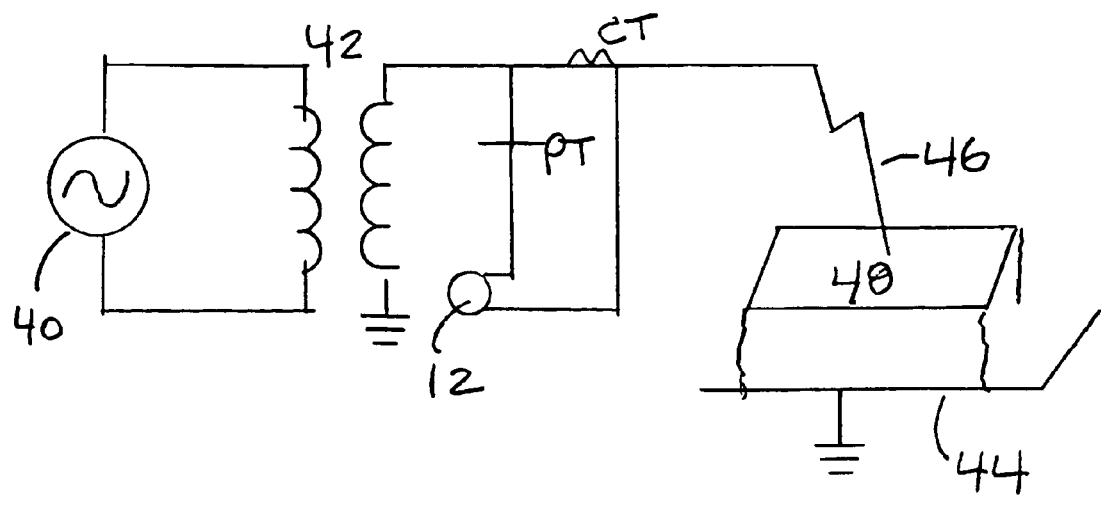
FIG. 3 is a block diagram showing an exemplary laboratory model developed to experimentally stage high impedance faults and to collect data for testing and evaluation.

FIG. 3 shows in simplified form an exemplary laboratory model that was developed to experimentally stage high impedance faults and to collect data for testing and evaluation. The exemplary setup included two 120/4500 V, 1 kVA transformers 42 connected in parallel and energized from a 120 V, 15 A, 60 Hz power source 40. As shown in FIG. 3, a bare conductor 46 was connected to one terminal of the transformer secondaries to simulate a downed transmission line. The other secondary terminal was connected to a copper plate 44 buried in soil 48, thereby simulating the ground electrode and the earth.

The bare conductor was dropped on a variety of soil surfaces to investigate differences in the resulting currents. The HIF current signatures were collected using a data acquisition system based upon the use of National Instruments data acquisition and signal conditioning boards with Lab-VIEW software operating on Windows NT. The data was sampled at 20 kHz, quantized to 14 bits and stored in binary format. Each HIF trial case was conducted for a 50 second duration.

Fifteen cases were run for seven different wet surface conditions (wet and frozen sod, soil, asphalt, gravel, sand, and concrete) for a total of 105 HIF cases. This data acquisition scheme was also used to collect signatures for non-HIF currents for single-phase nonlinear loads (e.g., TV, fluorescent lamp, PC, bridge rectifier, a phase-controlled motor drive, and arc welder). A total of 22 non-HIF files were created.

Signal Model

The HIF detection algorithms developed in this exemplary study are based on using HIF current signatures in all of the 3-phases and/or ground which are considered non stationary, temporally varying, and of various burst duration. Even though HIF signals do resemble the third harmonic component of the current, other harmonic components as well as non-harmonic components can play a vital role in HIF detection. One challenge is to develop a data model that acknowledges that high impedance faults could take place at any time within the observation window of the current and could be delayed randomly and attenuated substantially depending on the fault location away from the measuring station. The exemplary model is motivated by previous HIF research, actual experimental observations in the lab, and what traditionally represents an accurate depiction of a non stationary signal with time dependent spectrum.

The HIF detection problem addressed in this exemplary study is formulated as such:

$$\text{Hypothesis } H0: r(t)=s(t)+n(t) \tag{1}$$

$$\text{Hypothesis } H1: r(t)=s(t)+n(t)+f(t) \tag{2}$$

where r(t) represents the monitored phase and/or ground currents. It is assumed that all current recordings are corrupted with additive Gaussian noise n(t). The HIF signature is denoted by f(t) and represents the instantaneous value of the HIF current. Normal load signals are denoted by s(t) and thus Hypothesis H0 represents a no HIF situation and Hypothesis H1 represents a HIF situation.

High Impedance Fault (HIF) Detection using Wavelet Based System

FIG. 4 is a flowchart showing an exemplary wavelet based HIF detection application. After the data is acquired in 50, it is filtered in 52, using a bandpass filter of 320–400 Hz, and then, as is described in detail below, it is decomposed in separate high and low pass wavelet decomposition filters in 54. The energy is then calculated in 56 and the calculated energy is compared to a threshold in 58 to determine if a HIF has occurred.

The following is an exemplary application of high impedance fault detection using a wavelet based high impedance fault detection system. The continuous wavelet transform of r(t) is $$C_{p,s} = \int_{-\infty}^{\infty} r(t)\varphi\left(\frac{t-p}{s}\right)dt \tag{3}$$

where, the wavelet is $\varphi(t)$, p is the position and s is the scale.

The position argument keeps track of the temporal change in current harmonics which is essential to HIF detection and the scale change keeps track of bands of frequencies of the current load. Both position and scale are continuous, therefore the above transform is not suited for computation. A discrete version of the transform is needed which is given by, $$C_{mn} = \sum_{k} r(t)\varphi\left(\frac{k-m}{2^n}\right) \tag{4}$$

where, k, m and n are all integers.

The above transform is implemented by multi resolution analysis where the signal is decomposed into a low pass and a high pass component via two separate low pass and high pass filters known as wavelet decomposition filters. After filtering, both low pass and high pass signals are down sampled by a factor of 2. The high pass signal component corresponds to the first detail look of the signal. The second detail look can be obtained by further decomposition of the current low pass signal into two new low pass and high pass components. The third, fourth, etc. detail signals can be obtained by further decomposition of subsequent low pass components.

The original signal can be reconstructed with minimal error from its low pass and high pass components in a reverse pyramidal manner. It is in these high pass components where distinct HIF features can be located and distinguished from signatures of other nonlinear loads of transient and bursty nature. The decomposition filters are associated with the type of mother wavelet used.

Most of the exemplary tests of this technique were conducted using the Daubechies-4 wavelet which is not a very smooth wavelet but requires less computation time. Use of other wavelets or other Daubechies wavelets did not show any noticeable change in performance nor in the threshold parameters used.

The exemplary HIF detection algorithm developed for the wavelet based system examines overlapping windows of the current at different scales and details via a wavelet transform. Although proper HIF detection can be accomplished using more than a single scale, experimental testing indicated that the energy component of the seventh detail signal carries the most significant HIF information that is more distinguishable from other normal arcing loads or normal nonlinear loads. The additional preprocessing needed is a FFT to render the current with all its random delay components position insensitive.

Thus, the preferred algorithm relies on evaluating the energy of the seventh detail signal of the magnitude of the FFT of a current. That energy is compared to a fixed threshold and to the energy of the previous data segment. The combined decision results in a fault/no fault determination. This detection scheme delivers about 80% detection with about a 0.5% false alarm rate in the absence of arc welding loads. If the HIF attenuation parameters were lower limited to 0.1 (i.e. typically high impedance fault detection systems are not interested in detecting very weak currents), the detection rate increases to about 95% with about a 0.1% false alarm rate. The detection performance drops to about 65% in the presence of arc welding signals and without considering any lower limits on attenuation. The false alarm rate remains under about 1%.

The seventh detail signal obtained via wavelet decomposition corresponds to the frequency range between the second and fifth harmonic (about 156–312 Hz). The importance of the proposed detection scheme is in considering the third, fourth, and fifth harmonic as well as the in-between harmonics frequencies as a block of features for HIF detection. Furthermore, the temporal change in HIF currents is accounted for in the temporal change of the seventh detail signal.

High Impedance Fault (HIF) Detection using Higher Order Statistics Based System

FIG. 5 is a flowchart showing an exemplary higher order statistics based HIF detection system. The data is acquired in 50, it is filtered in 52 using a bandpass filter of 320–400 Hz. The data acquisition and filtering in this application are both the same as the data acquisition and filtering described for the wavelet based HIF detection system of FIG. 4 and thus have in FIG. 5 the same reference numerals as is used in FIG. 4 for those functions. The energy is then calculated in 60 and the calculated energy is compared to a threshold in 62 to determine if a HIF has occurred.

An exemplary detection system and algorithm based on examining the higher order statistical features of normal currents has been developed and tested, as discussed below. Higher order spectra, namely the bispectrum and trispectrum are traditionally recognized as important feature extraction mechanisms that are associated with the third and fourth order cumulants of random signals. The bispectrum and the trispectrum are by definition the two dimensional and three dimensional Fourier transform of the third and fourth order cumulants defined as, $$C2(m,n)=E\{r(t)r(t+m)r(t+n)\} \quad (5)$$

$$C3(m,n,k)=E\{r(t)r(t+m)r(t+n)r(t+k)\} \quad (6)$$

where E stands for the expected value.

The exemplary algorithm implemented in this study is due in part to Tugnait (see, J. Tugnait, "Detection of Random Signals by Integrated Polyspectral Analysis", IEEE Transactions on Signal processing, Vol. 44, No. 8, pp. 2102–2108, August 1996) and utilizes the integrated polyspectra of single-phase current loads. This reference in incorporated herein by reference in its entirety.

The detector is developed such that a detection decision is made either using second order statistics at a preliminary stage or using third and fourth order statistics at an additional stage. The basic concept is as follows: what is the achievable detection decision assuming accessibility to second, third, and fourth order statistics for a given set of data and a fixed false alarm rate. First, it is determined whether a fault exists using only second order statistics. If the detection cannot be made, an alternative test based on third and fourth order cumulants is triggered. Both tests combined are designed such that the probability of false alarm is fixed and predetermined by the system operator. Clearly, this detector uses additional information beyond energy signatures.

Preferably, this detector relies on all current spectra including the in-between harmonics as generated by the pre-processing filter described earlier. The HIF detector is itemized as follows:

I. Declare a fault, if $s_{ed} > T_{\alpha_s}$

Where, the signature $s_{ed}$ denotes the second order statistics of the data r(t) and $T_{\alpha_s}$ is the threshold. $s_{ed}$ is defined as, $$s_{ed} = \frac{1}{\sigma_n^2} \sum_{i=1}^{N} r^2(t), \quad (7)$$

where, $\sigma_n^2$ is the variance of r(t) given Hypothesis H(0) which is a no fault situation.

The threshold $T_{\alpha_s}$ is chosen such that, $$P(X_N^2(0) > T_{\alpha_s}) = \alpha_h \quad (8)$$

where, $X_N^2(0)$ denotes the non-centered chi-squared distribution of N degrees of freedom.

The parameters $\alpha_s$ and $\alpha_h$ are set by the designer such that, $$\alpha_s + (1-\alpha_s)\alpha_h = \alpha \tag{9}$$

where, $\alpha$ is the predetermined probability of false alarm.

II. If a detection cannot be made with the previous test, then the following step is used. Declare a fault, if, $$s_h > T_{\alpha_h}$$

where, the signature $s_h$ denotes the third order statistics of the data r(t) and $T_{\alpha_h}$ is the threshold.

The threshold $T_{\alpha_h}$ is chosen such that, $$P(X_{4L}^2(0) > T_{\alpha_h}) = \alpha_h \tag{10}$$

where, $X_{4L}^2(0)$ denotes the non-centered chi-squared distribution of N degrees of freedom.

The parameters $\alpha_s$ and $\alpha_h$ are set by the designer such that, $$\alpha_s + (1-\alpha_s)\alpha_h = \alpha \tag{11}$$

where, $\alpha$ is the predetermined probability of false alarm.

The data of length N is divided into L segments each of length $N_B$. The third order statistics $s_h$ is a scalar and defined as, $$s_h = \sum_{m=1}^{\frac{N_B}{2}-1} V_h^{Tr}(\omega_m)(D_{hm0})^{-1} V_h(\omega_m), \tag{12}$$

The vector $V_h$ is defined as, $$V_h(\omega_m) = [Re\{S_{c_{2r}}(m)\} Im\{S_{c_{2r}}(m)\} Re\{S_{c_{3r}}(m)\} Re\{S_{c_{3r}}(m)\}]^T \tag{13}$$

The transpose symbol used is T and $$\omega_m = \frac{2\pi m}{N_B}$$

with m=1, 2, . . . , L.

Thus, $\omega_m$ represents all the spectral components of the recorded current. The real and imaginary components are denoted by Re and Im respectively. The inverted matrix $D_{h m0}$ used in the example above is defined as a diagonal matrix with elements representing the integrated polyspectra of the no fault signal.

$$D_{hm0} = \tag{14}$$
$$diag\left[\frac{S_{rr}(\omega_m)}{2K}\{S_{c_{2n}c_{2n}}(\omega_m), S_{c_{2n}c_{2n}}(\omega_m), S_{c_{3n}c_{3n}}(\omega_m), S_{c_{3n}c_{3n}}(\omega_m)\}\right]$$

The integrated bispectral and trispectral components are defined as, $$S_{c_{lr}} = \frac{1}{K}\sum_{i=1}^{K}\left[\frac{1}{N_B}C_{lr}^i(\omega_m)R^{(i*)}(\omega_m)\right] \tag{15}$$

where, $C_{lr}$=FFT$\{c_{lr}\}$ and the cumulants are defined as, $$c_{1r} = r(t), c_{2r} = r^2(t) \text{ and } c_{3r} = r^3(t) - \frac{3r(t)}{N}\sum_{t=1}^{N}r^2(t) \tag{16}$$

Finally, $R(\omega_k)$ is the Fourier Transform r(t).

The above exemplary algorithm was tested using the collected data and the results indicate a probability of detection of about 97.14% with a zero false alarm rate for a total of 630 cases which includes two arc welder loads. Thresholds were set such that the false alarm rates $\alpha_s$=0.05 and $\alpha_h$=0.05 which corresponds to an overall false alarm rate of about 0.09. The higher order statistics were invoked about 4% of the time. These results indicate that higher order signatures are distinguishable from welding and other non-linear loads.

High Impedance Fault (HIF) Detection using Artificial Neural Network (ANN)

FIG. 6 is a flowchart showing neural network based HIF detection application. The data is acquired in 50, it is filtered in 52 using a bandpass filter of 320–400 Hz. The data acquisition and filtering in this application are both the same as the data acquisition and filtering described for the wavelet based HIF detection system of FIG. 4 and thus have in FIG. 6 the same reference numerals as is used in FIG. 4 for those functions. The samples are transformed in 64 using a fast Fourier transform (FFT) which is used only in the second neural network embodiment described below, and then mapped into the HIF plane in 66 using the neural network algorithm and compared to a threshold in 68 to determine if a HIF has occurred.

The following is an exemplary application of high impedance fault detection using a neural network based high impedance fault detection system. Artificial Neural Networks (ANNs) have been successfully used in many applications to solve complex classification problems due to their ability to create non-linear decision boundaries. The most common and flexible neural network is the multi-layer perceptron (MLP) which is constructed from a series of neurons.

The first neural networks investigated used 1000 input nodes to the network (1000 samples over 3 cycles at 20 kHz). No attempt was made to synchronize the zero crossing of the monitored current to the first input node of the neural network with the hopes of reducing implementation complexity. The best results occurred when using 200 nodes in the hidden layer. The network was trained with 600 input/target cases (300 HIF and 300 non-HIF) and had a sum-squared error of 1.4 after completion of learning (1 missed HIF detection and 0 false alarms). Generalization performance was determined by testing the network on 3600 new 3 cycle windows (1800 HIF and 1800 non-HIF). Considering all network output greater than 0.5 to indicate the presence of an HIF event, the network achieved a detection rate of 70.83% with a 22.06% false alarm rate.

One embodiment of a neural network design used the spectrum of the 3-cycle window of data. The magnitude of the FFT of the 1000 samples was truncated at the 13th harmonic. This resulted in a reduction to only 40 input nodes for the neural network. This network had fewer weights and biases and could be trained almost an order of magnitude faster. The best results occurred when 30 nodes were used in the hidden layer. The network was trained with 600 cases and had a sum-squared error of 11.8 (8 missed detections and 4 false alarms). Generalization testing on 3600 new inputs resulted in about an 86.06% detection rate with about a 17.06% false alarm rate. The increased performance of this network over the previous network is likely due to the invariance of the frequency spectrum to phase shifts. These performance figures are once again based upon using about 0.5 as the output threshold for indicating a detected HIF. An attempt was made to reduce the false alarm rate by increasing the output threshold to about 0.75. This resulted in about a 83.7% detection rate with about a 14.8% false alarm rate. Increasing the threshold to about 0.95 resulted in about a 77.7% detection rate and about a 11.8% false alarm rate.

Another exemplary network architecture was a combination of the two previous networks operating in parallel. If the output of both networks was greater than 0.5, then a positive HIF decision was indicated. A decision that no HIF was present was made if the output of both networks was less than 0.5. For the cases in which the two neural networks disagreed as to the presence of a HIF current, the output of the two networks was summed and a variable threshold was used to make the decision. A threshold of 1.0 corresponded to making the final decision based upon which network was more confident in its own decision.

For example, if the output of network 1 was 0.9867 and the output of network 2 was 0.0175, then the sum would be less than 1.0 and a no HIF decision would be made because the output of network 2 is closer to the ideal value of 0 than the output of network 1 is to the ideal value of 1.

On the other hand, if a more conservative approach were desired in which one chose to reduce the false alarm rate, a larger threshold approaching 1.5 could be selected. In essence, a larger threshold gives more weight to the network that indicates a no HIF situation.

Table 1 summarizes the performance as this threshold is varied.

TABLE 1

Change in Detection and False Alarm Rates with Threshold.

| | Threshold | | | | | |
|---|---|---|---|---|---|---|
| | 1.0 | 1.1 | 1.2 | 1.3 | 1.4 | 1.5 |
| Detection Rate | 85.4% | 74.9% | 71.7% | 68.7% | 66.9% | 65.3% |
| False Alarm Rate | 16.1% | 9.2% | 7.8% | 7.2% | 6.6% | 6.1% |

The results indicate that the network using the spectrum (FFT) of the monitored current is more capable of detecting HIF than the network using the actual current samples. Using the sampled current network in tandem with the spectrum based network can reduce the false alarm rates, however, it doesn't appear to increase the detection rate significantly. The lack of synchronizing the current's zero-crossing during training and generalization may prohibit this neural network from detecting some of the patterns or features attributed to HIFs, such as asymmetry of half cycles and variations from cycle to cycle. The results are encouraging given that the detection is performed on only a 3 cycle snapshot of data.

High Impedance Fault (HIF) Detection using a Composite System

Referring once again to FIG. 2 there is shown an exemplary composite HIF detection system 12 that includes all of the three different techniques described above.

As can be seen from the test results of the three different HIF techniques 22, 24, 26 described above, none of them can detect all HIF faults while assuring no false alarms. The present invention evaluates the presence of HIF fault with all the above techniques and uses a multi-resolution framework having a decision logic 32 to detect the presence of high impedance fault. A fault is identified as a high impedance fault once it is independently detected by any two of a plurality of individual high impedance fault detection systems.

An exemplary decision logic is described below:

```
             if (Technique 1 = true); and
             if ((Technique 2 = true) OR (Technique 3 =
   true)),
                 then HIF = TRUE
                 end;
             else, if (Technique 1 = false); and
                 if ((Technique 2 = true) AND
             (Technique 3 = true))
                 then HIF = TRUE
                 end
             end.
``` where, Technique 1 is the logical output (true or false) from the wavelet based algorithm; Technique 2 is the logical output from the algorithm based on higher order statistics; and Technique 3 is the logical output from the ANN based technique. For the above example, the logical output of any individual technique is true if that technique detects an HIF, otherwise it is false.

It is to be understood, however, that even in numerous characteristics and advantages of the present invention have been set forth in the foregoing description, together with details of the structure and function of the invention, the disclosure is illustrative only, and changes may be made to detail, especially in matters of shape, size and arrangement of parts within the principles of the invention to the full extent indicated by the broad general meaning of the terms in which the appended claims are expressed.

What is claimed is:

1. A method for detecting a high impedance fault in an electrical power line comprising:

providing a plurality of high impedance fault detection means;

providing a decision means;

using said plurality of high impedance fault detection means to make a plurality of independent determinations whether said high impedance fault has occurred, respectively;

generating outputs representative of said independent determinations; and using said decision means to determine whether said high impedance fault has occurred, wherein said decision means determines that said high impedance fault has occurred if any two or more of said outputs indicate that said high impedance fault has occurred.

2. The method of claim 1 wherein said plurality of high impedance fault detection means are at least three.

3. The method of claim 1 wherein said plurality of high impedance fault detection means are at least three and each of said outputs has one of first and second logic states, said first logic state indicating the presence of said high impedance fault and said second logic state indicating the absence of said high impedance fault; and wherein said decision means determines that said high impedance fault has occurred if any two or more of said outputs have said first logic state.

4. The method of claim 1, wherein the step of providing a plurality of high impedance fault detection means comprises providing a wavelet based system, a higher order statistics based system and a neural network based system.

5. The method of claim 4, further comprising:
receiving an electrical signal from a sensing device coupled to said electrical power line;
filtering said electrical signal with a bandpass filter of 320 to 400 Hz; and
inputting said filtered electrical signal into said wavelet based system, said higher order statistics based system and said neural network based system.

6. A system for detecting a high impedance fault in an electrical power system having an alternating current flowing therethrough comprising:
an electrical power supply;
one or more interconnected electrical power conductors; and
a composite high impedance fault detection system connected to said one or more electrical power conductors for detecting said high impedance fault, said composite high impedance fault detection system comprising:
a plurality of high impedance fault detection systems operable to respectively make a plurality of independent determinations whether said high impedance fault has occurred and to respectively generate outputs representative of said independent determinations; and
decision means connected to said high impedance fault detection systems for determining whether said high impedance fault has occurred, said decision means determining that said high impedance fault has occurred if any two or more of said outputs indicate that said high impedance fault has occurred.

7. The system of claim 6, wherein said plurality of high impedance fault detection systems comprise:
a wavelet based system;
a higher order statistics based system; and
a neural network based system.

8. The system of claim 6, further comprising a sensing device coupled to one or more of said one or more electrical power conductors for sensing current flow on said conductors and a bandpass filter disposed between said one or more of said sensing device and said composite high impedance fault detection system.

9. The system of claim 6, further comprising a microprocessor in which said composite high impedance fault detection system is implemented.

10. The system of claim 9, wherein said microprocessor also performs non-high impedance fault detection algorithms and control algorithms.

11. The system of claim 6, wherein said plurality of high impedance fault detection systems are at least three and each of said outputs has one of first and second logic states, said first logic state indicating the presence of said high impedance fault and said second logic state indicating the absence of said high impedance fault; and
wherein said decision means determines that said high impedance fault has occurred if any two or more of said outputs have said first logic state.

12. An apparatus for detecting a high impedance fault in electrical power lines comprising:
a wavelet based system for detecting said high impedance fault condition in said electrical power lines and having a first logical output;
a higher order statistics based system for detecting said high impedance fault condition in said electrical power lines and having a second logical output; and
a neural network based system for detecting said high impedance fault condition in said electrical power lines and having a third logical output,
a decision logic for determining whether said high impedance fault has occurred, wherein said decision logic determines that said high impedance fault has occurred if any two of said first logical output, said second logical output, and said third logical output indicate that said high impedance fault has occurred.

13. The apparatus of claim 12, wherein the apparatus is a protective relay; and
wherein each of said first, second and third outputs each have one of first and second logic states, said first logic state indicating the presence of said high impedance fault and said second logic state indicating the absence of said high impedance fault; and
wherein said decision logic determines that said high impedance fault has occurred if any two or more of said first, second and third outputs have first logic states.

14. The apparatus of claim 13, further comprising a bandpass filter of 320 to 400 Hz for connection between said electrical power lines and said wavelet based system.

15. The apparatus of claim 13, further comprising a microprocessor in which said wavelet based system, said higher order statistics based system and said neural network based system are implemented.

16. The apparatus of claim 15, wherein said microprocessor also performs non-high impedance fault detection algorithms and control algorithms.

17. An apparatus for detecting a high impedance fault in electrical power lines comprising:
a composite high impedance fault detection system for connection to said electrical power lines for detecting said high impedance fault, said composite high impedance fault detection system comprising:
a plurality of high impedance fault detection systems operable to respectively make a plurality of independent determinations whether said high impedance fault has occurred and to respectively generate outputs representative of said independent determinations: and
decision means connected to said high impedance fault detection systems for determining whether said high impedance fault has occurred, said decision means determining that said high impedance fault has occurred if any two or more of said outputs indicate that said high impedance fault has occurred.

18. The apparatus of claim 17, wherein said apparatus is a protective relay; and
wherein said plurality of high impedance fault detection systems are at least three and each of said outputs has one of first and second logic states, said first logic state indicating the presence of said high impedance fault and said second logic state indicating the absence of said high impedance fault; and
wherein said decision means determines that said high impedance fault has occurred if any two or more of said outputs have said first logic state.

* * * * *